(12) United States Patent
Xie

(10) Patent No.: US 10,916,609 B2
(45) Date of Patent: Feb. 9, 2021

(54) ARRAY SUBSTRATE AND METHOD FOR MANUFACTURING ARRAY SUBSTRATE

(71) Applicant: WUHAN CHINA STAR OPTOELECTRONICS SEMICONDUCTOR DISPLAY TECHNOLOGY CO., LTD., Hubei (CN)

(72) Inventor: Yan Xie, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 16/484,509

(22) PCT Filed: Nov. 19, 2018

(86) PCT No.: PCT/CN2018/116217
§ 371 (c)(1),
(2) Date: Aug. 8, 2019

(87) PCT Pub. No.: WO2020/082472
PCT Pub. Date: Apr. 30, 2020

(65) Prior Publication Data
US 2020/0203455 A1 Jun. 25, 2020

(30) Foreign Application Priority Data

Oct. 23, 2018 (CN) .......................... 2018 1 1237408

(51) Int. Cl.
*H01L 27/12* (2006.01)
*H01L 27/32* (2006.01)
(Continued)

(52) U.S. Cl.
CPC ...... *H01L 27/3258* (2013.01); *H01L 27/3246* (2013.01); *H01L 27/3262* (2013.01);
(Continued)

(58) Field of Classification Search
CPC ........... G02F 1/133345; G02F 1/13439; H01L 27/1248; H01L 27/3276
See application file for complete search history.

(56) References Cited

U.S. PATENT DOCUMENTS

2008/0018850 A1* 1/2008 Shih ...................... H01L 27/124
349/152
2017/0141132 A1* 5/2017 Yin ................... H01L 29/78606
2019/0148474 A1   5/2019 Bu

FOREIGN PATENT DOCUMENTS

CN      103995381 A    8/2014
CN      105954953 A    9/2016
(Continued)

*Primary Examiner* — Thomas L Dickey
(74) *Attorney, Agent, or Firm* — Mark M. Friedman

(57) ABSTRACT

An array substrate and a method of manufacturing the same are provided. The array substrate sequentially includes a flexible substrate, a buffer layer, an active layer, a first gate insulating layer, a first gate metal layer, a second gate insulating layer, a second gate metal layer, an inter-insulating layer, a first organic filling layer, a source-drain wiring layer, a planarization layer, an anode layer, a pixel defining layer, and a supporting layer from bottom to top; the first organic filling layer is convex upward on the inter-insulating layer, making the source-drain wiring layer covering thereon disposed to be convex. The method of manufacturing the array, substrate is sequentially to manufacture the layers from bottom to top, wherein the convex first organic filling layer disposed on the inter-insulating layer of the array substrate is used to raise a drain thereon.

10 Claims, 4 Drawing Sheets

(51) Int. Cl.
*H01L 51/00* (2006.01)
*H01L 29/66* (2006.01)
*H01L 29/786* (2006.01)

(52) U.S. Cl.
CPC ...... *H01L 27/3265* (2013.01); *H01L 27/3276* (2013.01); *H01L 51/0097* (2013.01); *H01L 27/124* (2013.01); *H01L 27/1222* (2013.01); *H01L 27/1255* (2013.01); *H01L 27/1274* (2013.01); *H01L 29/66757* (2013.01); *H01L 29/78675* (2013.01); *H01L 2227/323* (2013.01); *H01L 2251/5338* (2013.01)

(56) References Cited

FOREIGN PATENT DOCUMENTS

| | | |
|---|---|---|
| CN | 107611145 A | 1/2018 |
| CN | 107994055 A | 5/2018 |
| KR | 20080055195 A | 6/2008 |
| KR | 20090108484 A | 10/2009 |

\* cited by examiner

ARRAY SUBSTRATE AND METHOD FOR MANUFACTURING ARRAY SUBSTRATE

BACKGROUND

1. Field of Invention

The present disclosure relates to the field of display technology, and more particularly to an array substrate and a method for manufacturing the array substrate.

2. Description of the Prior Art

Organic light-emitting displays (OLEDs) have a wide color gamut, a high contrast, energy saving and foldability, which make the OLEDs have a strong competitiveness in new generation displays. The foldability is one of key development directions of flexible displays.

A life span of electroluminescence devices is an important index parameter of the OLEDs. An opening rate of a pixel defining layer can be increased to extend the life span of the OLEDs, to slow down a brightness attenuation of the OLEDs and to improve product quality.

In the conventional OLED display panel, an anode thereof is connected to an exposed source-drain by a hole formed in a planarization layer, which electrically interconnects the source-drain and the anode. The hole makes the opening rate of the pixel defining layer become smaller.

Therefore, a new array substrate is needed to be developed to overcome the defects of the prior art.

SUMMARY

An object of the present disclosure is to provide an array substrate, which can increase an opening rate of pixel defining layer to extend a life span of OLEDs.

The present disclosure provides a following technical solution to realize the object above.

An array substrate, including a pixel area, and a bending area connected thereto; wherein the pixel area includes a flexible substrate, and a buffer layer, an active layer, a first gate insulating layer, a first gate metal layer, a second gate insulating layer, a second gate metal layer, an inter-insulating layer, a first organic filling layer, a source-drain wiring layer, a planarization layer, an anode layer, a pixel defining layer, and a supporting layer sequentially formed on the flexible substrate; wherein the active layer includes a source area and a drain area, the source-drain wiring layer including a source and a drain, the source electrically connected to the source area by a first hole, the drain electrically connected to the drain area by a second hole, and the anode layer electrically connected to the drain area by the drain; and wherein the first organic filling layer is convex upward on the inter-insulating layer, making the source-drain wiring layer covering thereon to be convex.

Wherein the drain is raised up by the first organic filling layer, making a protruding portion of the drain can connect to the anode layer directly and realizing an electrical connection between the drain and the drain area instead of forming a hole in the planarization layer.

Further, wherein a top surface of the protruding portion of the drain of the source-drain wiring layer is parallel to a surface of the planarization layer. That is, a protruding portion of the first organic filling layer makes the source-drain wiring layer also have the protruding portion partially. At the same time, the protruding portion of the source-drain wiring layer is convex upward and is parallel to the planarization layer instead of being covered by the planarization layer. Correspondingly, since there is no influence with the opening rate of the pixel defining layer without the hole, the opening rate of the pixel defining layer can be increased to a certain extent to extend the life span of the ° LED where the array substrate is located.

Further, wherein the first organic filling layer is convex upward to have an island-shaped structure.

Further, wherein the first organic filling layer is disposed on a side of the second hole away from the first hole.

Further, wherein the bending area includes a second organic filling layer disposed on the inter-insulating layer, a source-drain wiring layer disposed on the second organic filling layer, and a third hole which has an opening disposed in the inter-insulating layer and a bottom reaching the flexible substrate, wherein the second organic filling layer fills the third hole and partially protrudes from the inter-insulating layer.

An organic filling layer including the first organic filling layer and the second organic filling layer is used to realize a reduction of a bending pressure, and bending is to realize a narrow board design.

A method for manufacturing an array substrate, the array substrate including a pixel area and a bending area connected thereto, wherein the method includes steps:

S1, providing a flexible substrate;

S2, forming a buffer layer on the flexible substrate;

S3, forming an active layer on the buffer layer, and doping the active layer to form a source area and a drain area in the active layer;

S4, forming a first gate insulating layer on the active layer, forming a gate metal layer on the first gate insulating layer;

S5, forming a second gate insulating layer on the first gate metal layer, and forming a second gate metal layer on the second gate insulating layer;

S6, forming inter-insulating layer on the second gate metal layer, defining a first hole and a second hole in the pixel area, and defining a third hole in the bending area;

S7, forming an organic filling layer on the inter-insulating layer, wherein the organic filling layer includes a first organic filling layer and a second organic filling layer;

S8, forming a source-drain wiring layer on the organic filling layer, wherein the source-drain wiring layer includes a source and a drain disposed in the pixel area, and the source-drain wiring layer is disposed on the second organic filling layer of the bending area;

S9, forming a planarization layer on the source-drain wiring layer;

S10, forming an anode layer on the planarization layer, wherein the anode layer is electrically connected to the first organic filling layer and is positioned corresponding to the active layer;

S11, forming a pixel defining layer on the anode layer, and exposing the anode layer to form a fourth hole;

S12, forming a supporting layer on the pixel defining layer.

Further, wherein the step of S3 includes:

depositing an amorphous silicon layer on the buffer layer;
converting the amorphous silicon layer to a polycrystalline silicon layer by an excimer laser annealing process;
patterning the polycrystalline silicon layer and doping ions into the polycrystalline silicon layer to forming the active layer including the source area and the drain area.

Further, according to another embodiment, wherein the step of S3 includes:

depositing an amorphous silicon layer on the buffer layer;
patterning the amorphous silicon layer;

converting the amorphous silicon layer to a polycrystalline silicon layer by an excimer laser annealing process.

Further, wherein the step of S6 includes:

forming the first hole and the second hole in the pixel area and forming the third hole of the bending area by adopting a first etching process on the second gate insulating layer, wherein the first etching process makes bottoms of the first hole and the second hole reach the active layer; wherein the first hole makes the source area of the active layer exposed, and the second hole makes the drain area of the active layer exposed;

continue etching the third hole by adopting a second etching process to make bottom of the third hole reach the flexible substrate.

Further, wherein the step of S8 includes:

forming a second metal layer on the organic filling layer, and pattering the second metal layer to form the source and drain;

wherein the source is connected to the source area by the first hole, and the drain is connected to the drain area by the second hole.

An advantage of the disclosure is to provide the array substrate and the manufacturing method. Wherein the producing first organic filling layer is disposed on the inter-insulating layer of the array substrate to raise up the drain thereon and to make the drain connect to the anode layer directly instead of forming a hole in the planarization layer. Thereby the anode layer can be electrically connected to the drain area by the drain. Correspondingly, since there is no influence with the opening rate of the pixel defining layer without the hole, the opening rate of the pixel defining layer can be increased to a certain extent to extend the life span of the OLED where the array substrate is located.

The drain is no longer connected to the drain area by a hole, but a protruding portion of the drain raised up by the protruding first organic filling layer can be connected to the anode layer directly instead of forming a hole in the planarization layer. Therefore, effects of the hole on the opening rate of the pixel defining layer can be eliminated, and the opening rate of the pixel defining layer can be increased to extend the life span of the OLED where the array substrate is located.

Figure 1:
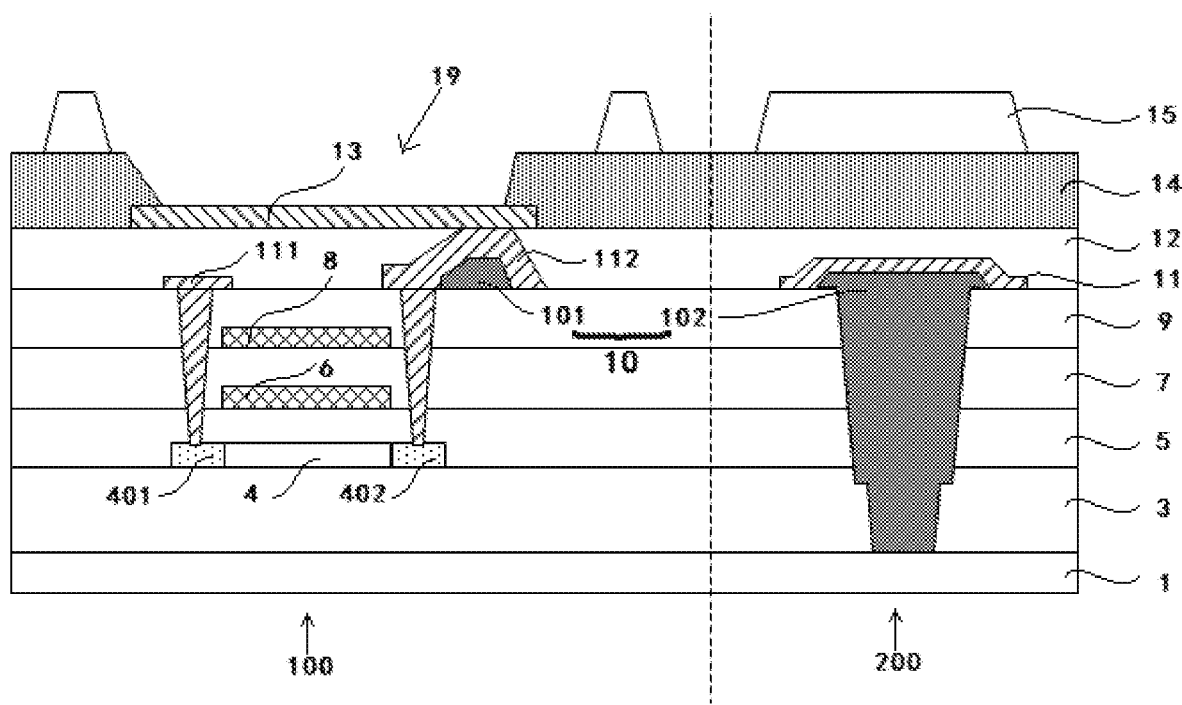
FIG. 1 is a schematic structural diagram of an array substrate according to the present disclosure.

Elements in the figures are identified as follows: a flexible substrate 1, a buffer layer 3, an active layer 4, a first gate insulating layer 5, a first gate metal layer 6, a second gate insulating layer 7, a second gate metal layer 8, an inter-insulating layer 9, an organic filling layer 10, a source-drain wiring layer 11, a planarization layer 12, a anode layer 13, a pixel defining layer 14, a supporting layer 15, a first hole 16, a second hole 17, a third hole 18, a fourth hole 19, a pixel area 100, a bending area 200, a first organic filling layer 101, a second organic filling layer 102, a source 111, a drain 112, a source area 401, and a drain area 402.

DETAILED DESCRIPTION OF PREFERRED EMBODIMENTS

The following description of each embodiment with reference to the accompanying drawings is used to exemplify a specific embodiment which may be carried out in the present disclosure. Directional terms mentioned in the present disclosure, such as "top", "bottom", "front", "back", "left", "right", "inside", "outside", "side" etc., are only used with reference to the orientation of the accompanying drawings. Therefore, the used directional terms are intended to illustrate, but not to limit, the present disclosure. In the accompanying drawings, the identical reference numerals denote the similar elements.

Please refer to FIG. 1, in which the present disclosure provides an array substrate including a pixel area 100 and a bending area 200 connected thereto. The pixel area 100 includes a flexible substrate 1, and a buffer layer 3, an active layer 4, a first gate insulating layer 5, a first gate metal layer 6, a second gate insulating layer 7, a second gate metal layer 8, an inter-insulating layer 9, a first organic filling layer 101, a source-drain wiring layer 11, a planarization layer 12, an anode layer 13, a pixel defining layer 14, and a supporting layer 15 sequentially formed on the flexible substrate 1. The active layer 4 includes a source area 401 and a drain area 402. The source-drain wiring layer 11 includes a source 111 and a drain 112. The source 111 electrically is connected to the source area 401 by a first hole 16. The drain 112 which covers the first organic filling layer 101 is electrically connected to the drain area 402 by a second hole 17. The anode layer 13 is electrically connected to the drain area 402 by the drain 112. The first organic filling layer 101 is convex upward on the inter-insulating layer 9, making the source-drain wiring layer 11 covering thereon to be convex.

The drain 112 is raised up by the first organic filling layer 101, making a protruding portion of the drain 112 connect with the anode layer 13 directly, thereby realizing an electrical connection between the drain 112 and the drain area 402, without the necessity to define a hole in the planarization layer 12.

Further, a top surface of the protruding portion of the drain 112 of the source-drain wiring layer 11 is parallel to a surface of the planarization layer 12. That is, a protruding portion of the first organic filling layer 101 makes the source-drain wiring layer 11 also have the protruding portion partially. At the same time, the protruding portion of the source-drain wiring layer 11 is convex upward and is parallel to the planarization layer 12, instead of being covered by the planarization layer 12.

Further, the first organic filling layer 101 is convex upward to have an island-shaped structure.

Further, the first organic filling layer 101 is disposed on a side of the second hole 17 away from the first hole 16.

Further, the bending area 200 also includes a second organic filling layer 102 disposed on the inter-insulating layer 9, a source-drain wiring layer 11 disposed on the second organic filling layer 102, and a third hole 18 which has an opening defined in the inter-insulating layer 9 and a bottom reaching the flexible substrate 1. The second organic filling layer 102 is filled in the third hole 18 and is partially protruded from the inter-insulating layer 9.

An organic filling layer 10 which includes the first organic filling layer 101 and the second organic filling layer 102 is used to realize a reduction of a bending pressure, and bending is to realize a narrow board design.

Figure 2:
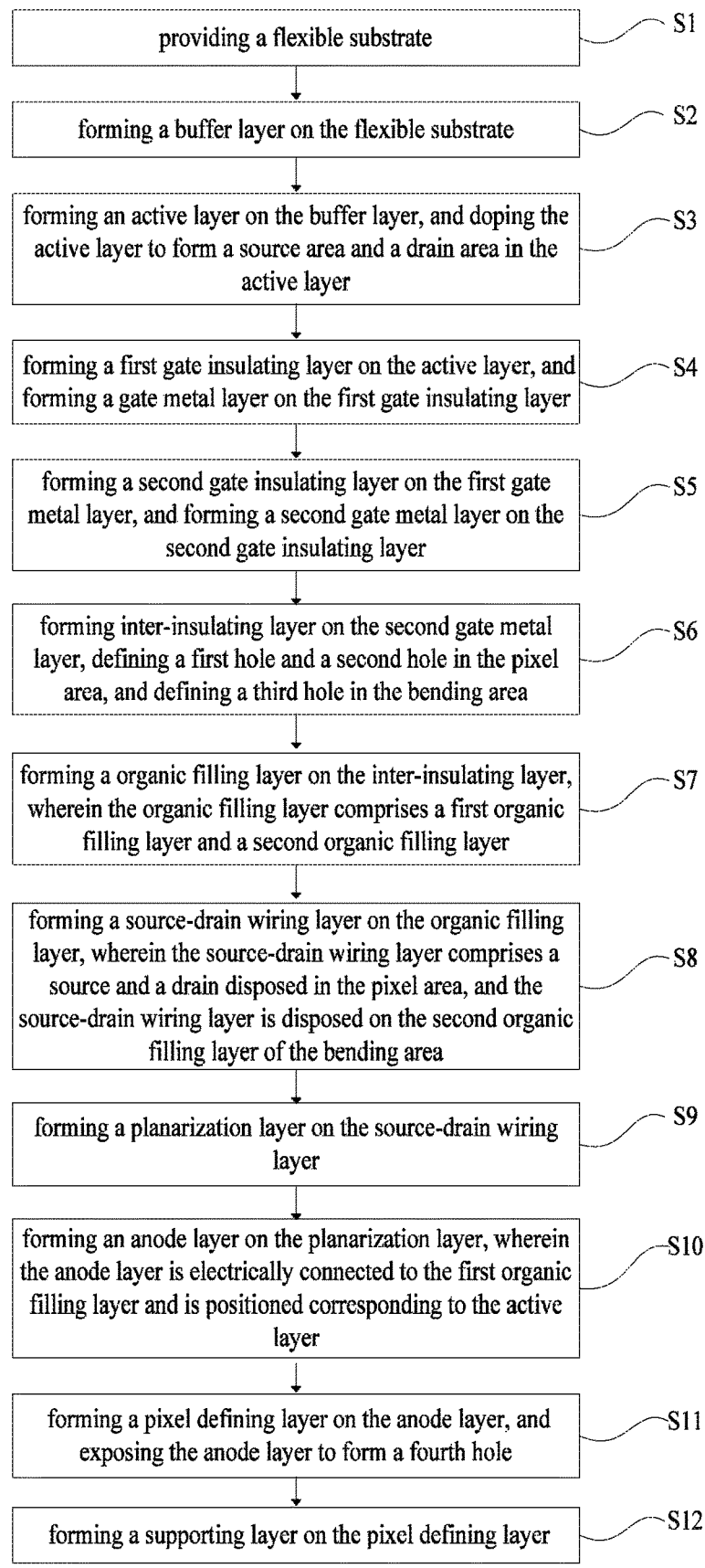
FIG. 2 is a flowchart of a method of manufacturing an array substrate according to the present disclosure.

Please refer to the FIG. 2, the present disclosure provides a method for manufacturing the array substrate. The array substrate including a pixel area 100 and a bending area 200 connected thereto, wherein the method includes steps:

Step S1 includes providing a flexible substrate 1.

The flexible substrate 1 include a flexible polyimide substrate.

Step S2 includes forming a buffer layer 3 on the flexible substrate 1.

The buffer layer 3 includes a multi-layer structure consisting of SiOx. SiNx or mixture thereof generally.

Step S3 includes forming an active layer 4 on the buffer layer 3, and doping the active layer 4 to form a source area 401 and a drain area 402 in the active layer 4.

The active layer 4 consists of polycrystalline silicon which is doped.

Figure 3:
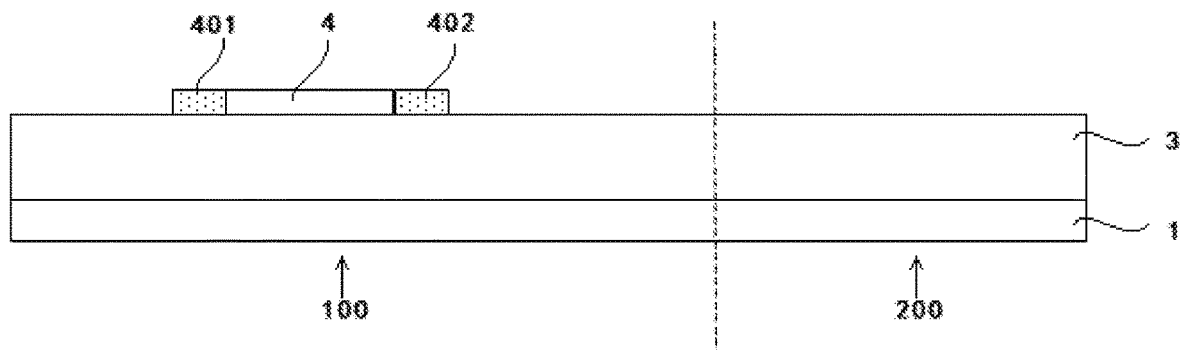
FIG. 3 is a schematic structural diagram of a product in connection with a step S1 to a step S3 of the method according to the present disclosure.

The steps S1 to S3 disclosed above can be specifically referred to FIG. 3. Specifically, according to an embodiment, the step S3 can include: depositing an amorphous silicon layer on the buffer layer first; then, converting the amorphous silicon layer to a polycrystalline silicon layer by an excimer laser annealing process, and then patterning the polycrystalline silicon layer and doping ions into the polycrystalline silicon layer to form the active layer 4 including the source area 401 and the drain area 402. In addition, the amorphous silicon layer can be patterned first, and then adopting the excimer laser annealing process to the patterned amorphous silicon layer.

Step S4 includes forming a first gate insulating layer 5 on the active layer 4, and forming a gate metal layer 6 on the first gate insulating layer 5.

The first gate insulating layer also generally can be made of SiOx, SiNx or a mixture thereof. The active layer 4 and the buffer layer 3 are covered by the first gate insulating layer 5.

A first metal layer (not shown) is formed on the first gate insulating layer 5, and the first metal layer is patterned to form the first gate metal layer 6 of the pixel area 100. Specifically, the first gate metal layer 6 is disposed corresponding to the active layer 4.

Step S5 includes forming a second gate insulating layer 7 on the first gate metal layer 6, and forming a second gate metal layer 8 on the second gate insulating layer 7.

The second gate insulating layer 7 is formed on the first gate metal layer 6, the second metal layer (not shown) is formed on the second gate insulating layer 7, and the second metal layer is patterned to form the second gate metal layer 8 of the pixel area 100. Specifically, the second gate metal layer 8 is disposed corresponding to the active layer 4. The second gate metal layer 8 is made of the same metal material for forming the first gate metal layer, and is patterned to form capacitors and a plurality of wires of a pixel driving circuit.

Step S6 includes forming inter-insulating layer 9 on the second gate metal layer 8, defining a first hole 16 and a second hole 17 in the pixel area 100, and defining a third hole 18 in the bending area 200.

Figure 4:
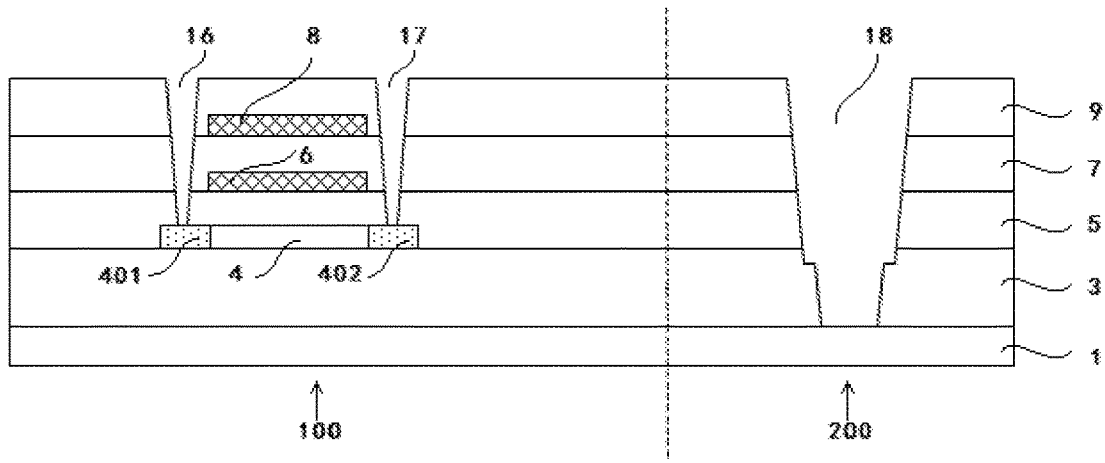
FIG. 4 is a schematic structural diagram of the product in connection with a step S4 to a step S6 of the method according to the present disclosure.

The steps S4 to S6 disclosed above can be specifically referred to FIG. 4. A bottom of the first hole 16 is disposed on the source area 401 of the active layer 4. A bottom of the second hole 17 is disposed on the drain area 402 of the active layer 4. And a bottom of the third hole 18 is disposed on the flexible substrate 1. The second gate metal layer 8 and the second gate insulating layer 7 are covered by the inter-insulating layer 9.

Specifically, the array substrate can be etched by a dry etching method including steps: forming the first hole 16 and the second hole 17 in the pixel area 100 and forming the third hole 18 of the bending area 200 by adopting a first etching process on the second gate insulating layer, wherein the first etching process makes bottoms of the first hole 16 and the second hole 17 reach the active layer 14; the first hole 16 makes the source area 401 of the active layer 4 exposed, and the second hole 17 makes the drain area 402 of the active layer 4 exposed; the third hole 18 is continuously etched by adopting a second etching process to make the bottom of the third hole 18 reach the flexible substrate 1.

Step S7 includes forming an organic filling layer 10 on the inter-insulating layer 9, wherein the organic filling layer 10 includes a first organic filling layer 101 and a second organic filling layer 102.

Figure 5:
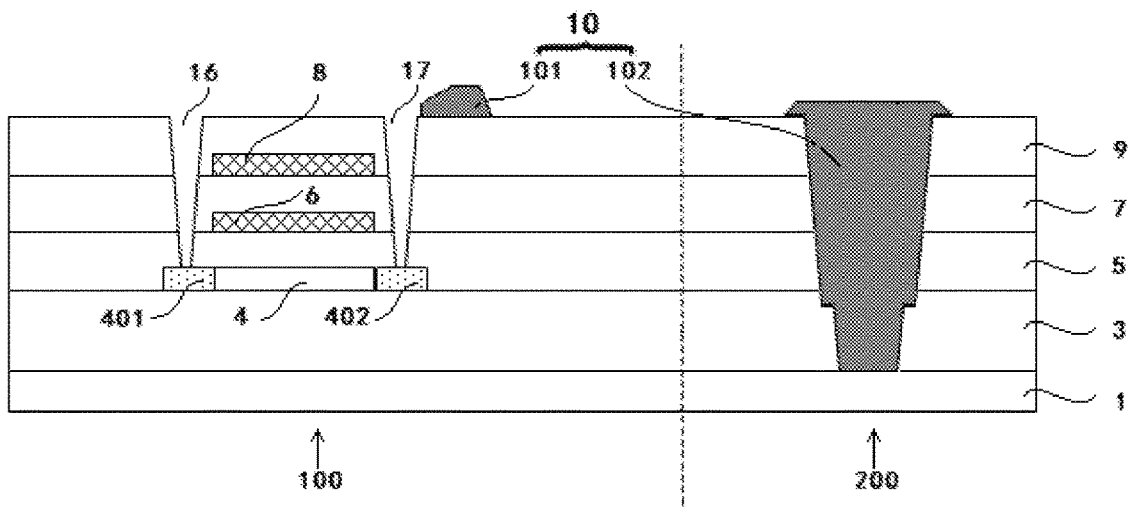
FIG. 5 is a schematic structural diagram of the product in connection with a step S7 of the method according to the present disclosure.

As shown in FIG. 5, an organic material is coated on the inter-insulating layer 9, and the organic material disposed on a side of the second hole 17 away from the first hole 16 and disposed correspondingly to the drain area 402 of the source layer 4 has an island-shaped structure. The organic material is filled in the third hole 18 to form the second organic filling layer 102. The coated organic material preferably is an organic material of oxidative dehydrogenation. In other embodiments, the organic material can be a flexible organic material such as polyimide resin or siloxane.

Step S8 includes forming a source-drain wiring layer 11 on the organic filling layer 10, wherein the source-drain wiring layer 11 includes a source 111 and a drain 112 disposed in the pixel area 100, and the source-drain wiring layer 11 is disposed on the second organic filling layer 102 of the bending area 200.

Figure 6:
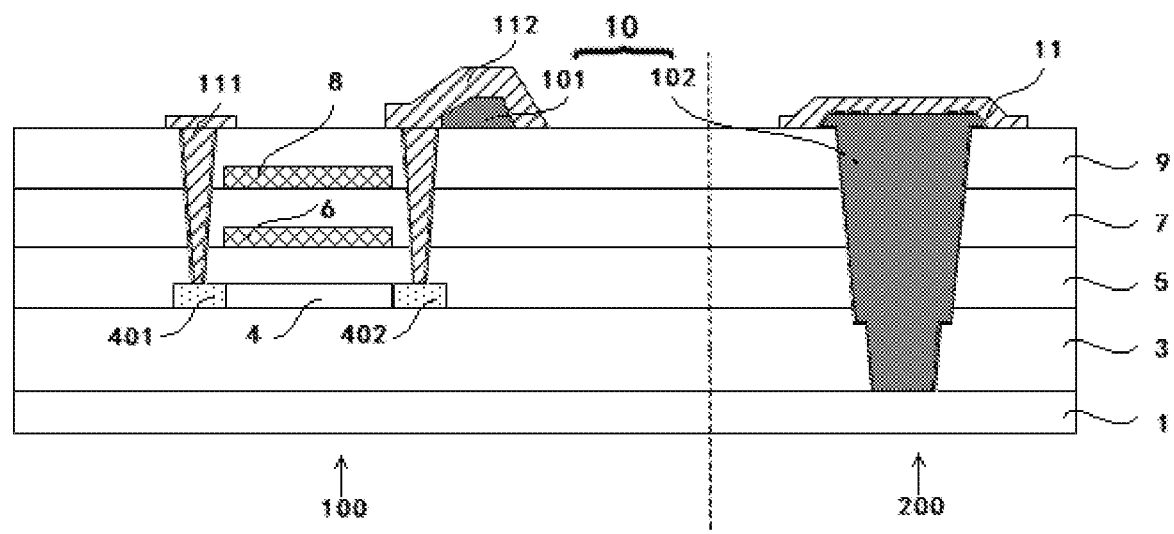
FIG. 6 is a schematic structural diagram of the product in connection with a step S8 according to the method of the present disclosure.

As shown in FIG. 6, specifically, the third metal layer (not shown) is formed on the organic filling layer 10 and the third metal layer is patterned to form the source 111 and the drain 112. The source 111 is electrically connected to the source area 401 by the first hole 16, and the drain 112 is electrically connected to the drain area 402 by the second hole 17 and covers the first organic filling layer 101.

Step S9 includes forming a planarization layer 12 on the source-drain wiring layer 11.

The planarization layer 12 is formed to flatten a top surface of the array substrate and is beneficial to perform subsequent operations.

The source-drain wiring layer 11 is covered by the planarization layer 12. At the same time, the protruding portion of the source-drain wiring layer 11 is convex upward and is parallel to the planarization layer 12, instead of being covered by the planarization layer 12.

That a height of the first organic filling layer 101 on the inter-insulating layer 9 of the pixel area 100 is higher than a height of the second organic filling layer 102 filling the third hole 18 of the bending area 200 can facilitate the anode layer 13 to be electrically connected to the drain area 402 by the drain 112.

The second organic filling layer 102 is filled in the third hole 18 to improve a flexibility of the array substrate and to improve a bending performance of a panel.

Step S10 includes forming an anode layer 13 on the planarization layer 12, wherein the anode layer 13 is electrically connected to the first organic filling layer 101 and is positioned corresponding to the active layer 4.

Step S11 includes forming a pixel defining layer 14 on the anode layer 13. and exposing the anode layer 13 to form a fourth hole 19.

The pixel defining layer 14 is electrically connected to the drain 112 by a hole in the planarization layer 12.

Figure 7:
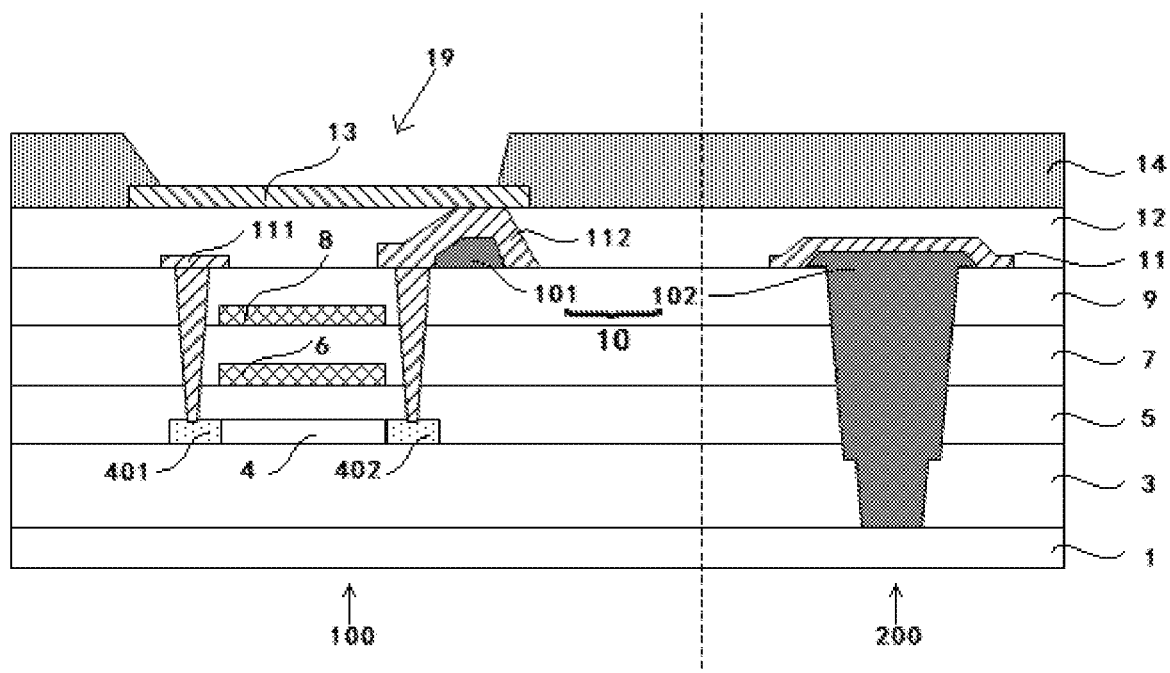
FIG. 7 is a schematic structural diagram of the product in connection with a step S9 to a step S11 of the method according to the present disclosure.

The steps S9 to S11 disclosed above can be specifically referred to FIG. 7.

Step S12 includes forming a supporting layer 15 on the pixel defining layer 14.

The description above is only a preferred embodiment of the present disclosure. It should be pointed out that various changes and modifications can be made to the invention in light of the above detailed description by those skilled in the art. These changes and modifications are possible within the scope of the invention as defined by the following claims.

What is claimed is:

1. An array substrate, comprising a pixel area, and a bending area connected thereto;
   wherein the pixel area comprises a flexible substrate, and a buffer layer, an active layer, a first gate insulating layer, a first gate metal layer, a second gate insulating layer, a second gate metal layer, an inter-insulating layer, a first organic filling layer, a source-drain wiring layer, a planarization layer, an anode layer, a pixel defining layer, and a supporting layer sequentially formed on the flexible substrate;
   wherein the active layer comprises a source area and a drain area, the source-drain wiring layer comprising a source and a drain, the source electrically connected to the source area by a first hole, the drain electrically connected to the drain area by a second hole, and the anode layer electrically connected to the drain area by the drain; and
   wherein the drain covers the first organic filling layer, wherein the first organic filling layer is convex upward on the inter-insulating layer, making the source-drain wiring layer covering thereon to be convex, and the anode layer is connected to the drain directly.

2. The array substrate as claimed in claim 1, wherein a top surface of a protruding portion of the drain of the source-drain wiring layer is parallel to a surface of the planarization layer.

3. The array substrate as claimed in claim 1, wherein the first organic filling layer is convex upward to have an island-shaped structure.

4. The array substrate as claimed in claim 1, wherein the first organic filling layer is disposed on a side of the second hole away from the first hole.

5. The array substrate as claimed in claim 1, wherein the bending area comprises a second organic filling layer disposed on the inter-insulating layer, a source-drain wiring layer disposed on the second organic filling layer, and a third hole which has an opening disposed in the inter-insulating layer and a bottom reaching the flexible substrate, wherein the second organic filling layer fills the third hole and partially protrudes from the inter-insulating layer.

6. A method for manufacturing an array substrate, the array substrate comprising a pixel area and a bending area connected thereto, wherein the method comprises steps:
   S1, providing a flexible substrate;
   S2, forming a buffer layer on the flexible substrate;
   S3, forming an active layer on the buffer layer, and doping the active layer to form a source area and a drain area in the active layer;
   S4, forming a first gate insulating layer on the active layer, and forming a gate metal layer on the first gate insulating layer;
   S5, forming a second gate insulating layer on the first gate metal layer, and forming a second gate metal layer on the second gate insulating layer;
   S6, forming an inter-insulating layer on the second gate metal layer, defining a first hole and a second hole in the pixel area, and defining a third hole in the bending area;
   S7, forming an organic filling layer on the inter-insulating layer, wherein the organic filling layer comprises a first organic filling layer and a second organic filling layer;
   S8, forming a source-drain wiring layer on the organic filling layer, wherein the source-drain wiring layer comprises a source and a drain disposed in the pixel area, and the source-drain wiring layer is disposed on the second organic filling layer of the bending area;
   S9, forming a planarization layer on the source-drain wiring layer;
   S10, forming an anode layer on the planarization layer, wherein the anode layer is electrically connected to the drain directly and is positioned corresponding to the active layer;
   S11, forming a pixel defining layer on the anode layer, and exposing the anode layer to form a fourth hole; and
   S12, forming a supporting layer on the pixel defining layer,
   wherein the first organic filling layer is located in the pixel area and interposed between the drain and the inter-insulating layer.

7. The manufacturing method as claimed in claim 6, wherein the step of S3 comprises:
   depositing an amorphous silicon layer on the buffer layer;
   converting the amorphous silicon layer to a polycrystalline silicon layer by an excimer laser annealing process;
   patterning the polycrystalline silicon layer and doping ions into the polycrystalline silicon layer to form the active layer comprising the source area and the drain area.

8. The manufacturing method as claimed in claim 6, wherein the step of S3 comprises:
   depositing an amorphous silicon layer on the buffer layer;
   patterning the amorphous silicon layer;
   converting the amorphous silicon layer to a polycrystalline silicon layer by an excimer laser annealing process.

9. The manufacturing method as claimed in claim 6, wherein the step of S6 comprises:
   forming the first hole and the second hole in the pixel area and forming the third hole of the bending area by adopting a first etching process on the second gate insulating layer, wherein the first etching process makes bottoms of the first hole and the second hole reach the active layer; wherein the first hole makes the source area of the active layer exposed, and the second hole makes the drain area of the active layer exposed;
   continue etching the third hole by adopting a second etching process to make bottom of the third hole reach the flexible substrate.

10. The manufacturing method as claimed in claim 6, wherein the step of S8 comprises:
    forming a second metal layer on the organic filling layer, and pattering the second metal layer to form the source and drain;
    wherein the source is connected to the source area by the first hole, and the drain is connected to the drain area by the second hole.

* * * * *